United States Patent
Cheng et al.

(10) Patent No.: US 10,591,941 B2
(45) Date of Patent: Mar. 17, 2020

(54) LOW DROPOUT REGULATOR WITH WIDE INPUT SUPPLY VOLTAGE

(71) Applicant: Etron Technology, Inc., Hsinchu (TW)

(72) Inventors: Wei-Chuan Cheng, Taipei (TW); Keng-Yi Wu, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 16/392,640

(22) Filed: Apr. 24, 2019

(65) Prior Publication Data
US 2019/0324484 A1    Oct. 24, 2019

Related U.S. Application Data

(60) Provisional application No. 62/662,213, filed on Apr. 24, 2018.

(51) Int. Cl.
| | |
|---|---|
| *G05F 1/575* | (2006.01) |
| *G05F 1/565* | (2006.01) |
| *H03K 5/24* | (2006.01) |
| *H02M 3/156* | (2006.01) |
| *H02M 1/00* | (2006.01) |
| *G05F 1/46* | (2006.01) |

(52) U.S. Cl.
CPC .............. *G05F 1/575* (2013.01); *G05F 1/565* (2013.01); *H03K 5/24* (2013.01); *G05F 1/461* (2013.01); *H02M 3/156* (2013.01); *H02M 2001/0032* (2013.01)

(58) Field of Classification Search
CPC .......... G05F 1/461; H02M 2001/0032; H02M 3/156
USPC .......... 323/274, 275, 282, 284, 285; 361/18
See application file for complete search history.

(56) References Cited

U.S. PATENT DOCUMENTS

| | | | |
|---|---|---|---|
| 7,218,168 B1* | 5/2007 | Rahman | G05F 1/56 323/273 |
| 8,729,876 B2* | 5/2014 | Shen | G05F 1/575 323/274 |
| 9,552,006 B1* | 1/2017 | Gorecki | G05F 1/565 |
| 2010/0109624 A1* | 5/2010 | Lourens | G05F 1/575 323/280 |
| 2015/0077076 A1* | 3/2015 | Bhattad | G05F 1/56 323/280 |
| 2016/0098050 A1* | 4/2016 | Enjalbert | G05F 1/56 323/280 |

\* cited by examiner

*Primary Examiner* — Gary A Nash
(74) *Attorney, Agent, or Firm* — Winston Hsu (57) ABSTRACT

A low dropout regulator with wide input supply voltage includes a controller, an comparing circuit, a feedback circuit, an adjustable source follower, and an adjustable driving circuit. The controller is used for detecting a supply voltage. The feedback circuit, the comparing circuit, the adjustable source follower, and the adjustable driving circuit are used for regulating an output voltage according to a reference voltage. When the adjustable source follower and the adjustable driving circuit operate in the low-voltage mode, the controller further activates a first parallel metal-oxide-semiconductor transistor in the adjustable source follower and a second parallel metal-oxide-semiconductor transistor in the adjustable driving circuit.

15 Claims, 6 Drawing Sheets

# LOW DROPOUT REGULATOR WITH WIDE INPUT SUPPLY VOLTAGE

CROSS REFERENCE TO RELATED APPLICATIONS

This application claims the benefit of U.S. Provisional Application No. 62/662,213, filed on Apr. 24, 2018 and entitled "Reducing LDO output dropout voltage with wide input supply voltage," the contents of which are incorporated herein by reference.

BACKGROUND OF THE INVENTION

1. Field of the Invention

The present invention relates to a low dropout regulator, and particularly to a low dropout regulator which has a wide input supply voltage.

2. Description of the Prior Art

Figure 1:
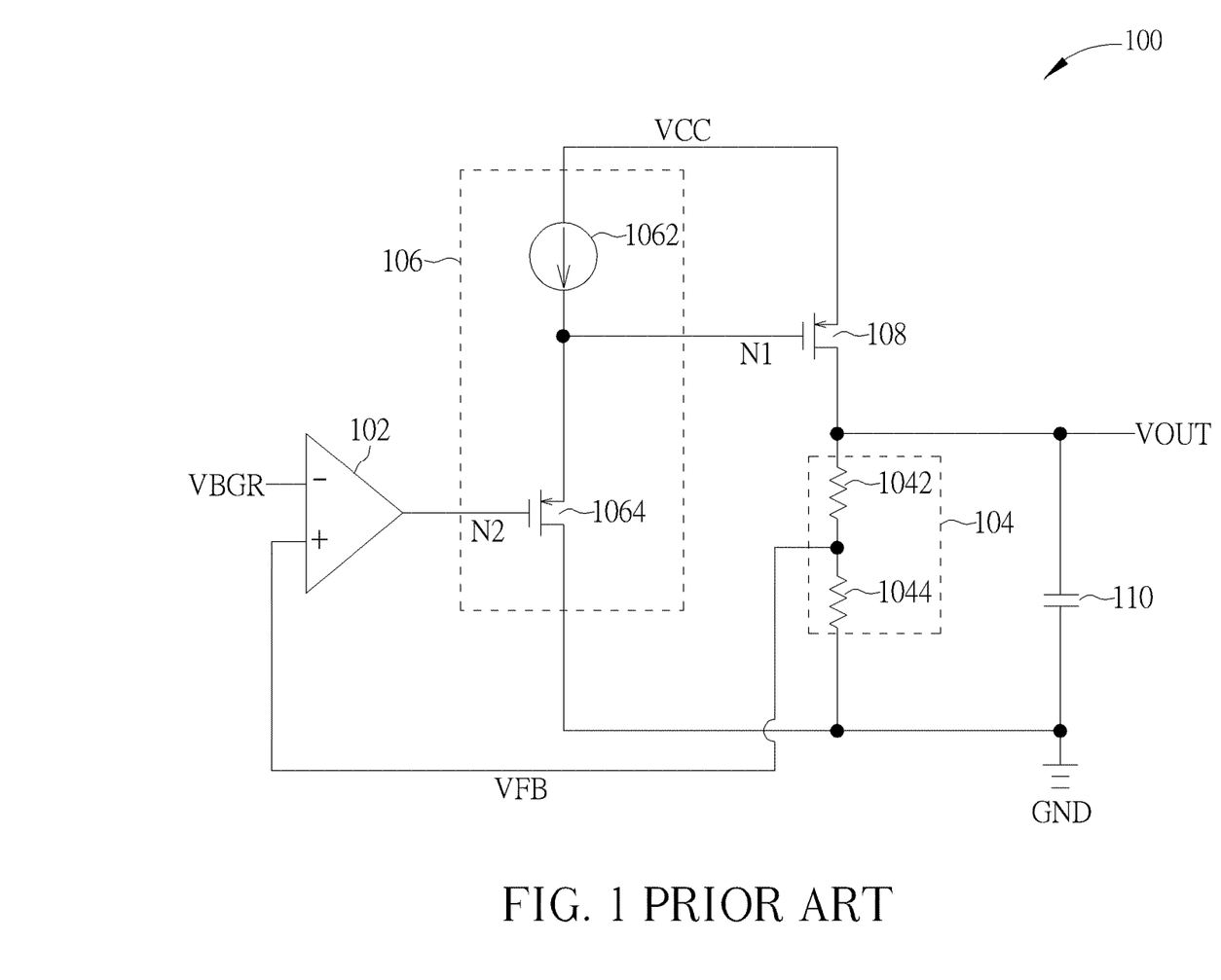
FIG. 1 is a diagram illustrating a low dropout regulator according to the prior art.

Please refer to FIG. 1. FIG. 1 is a diagram illustrating a low dropout regulator 100 according to the prior art. As shown in FIG. 1, the low dropout regulator 100 includes an error amplifier 102, a feedback circuit 104, a source follower 106, and a transmission transistor 108, wherein a supply voltage VCC is provided to the source follower 106, the error amplifier 102, and the transmission transistor 108. The source follower 106, the feedback circuit 104, the error amplifier 102, and a capacitor 110 are coupled to ground GND. In addition, coupling relationships between the error amplifier 102, the feedback circuit 104, the source follower 106, the transmission transistor 108, and the capacitor 110 can be referred to FIG. 1, so further description thereof is omitted for simplicity.

As shown in FIG. 1, the feedback circuit 104 includes resistors 1042, 1044, wherein the resistors 1042, 1044 form a voltage divider, and a relationship between an output voltage VOUT and a feedback voltage VFB can be determined according to equation (1):

$$VOUT = VFB\left(1 + \frac{R1}{R2}\right) \quad (1)$$

As shown in equation (1), R1 represents a resistance of the resistor 1042 and R2 represents a resistance of the resistor 1044.

As shown in FIG. 1, when the error amplifier 102 operates normally (that is, in a saturation region), the error amplifier 102 can control the transmission transistor 108 to output the output voltage VOUT through the source follower 106 according to a bandgap reference voltage VBGR. That is, the low dropout regulator 100 can utilize the bandgap reference voltage VBGR and a negative feedback loop formed by the error amplifier 102, the source follower 106, the transmission transistor 108, and the feedback circuit 104 to regulate the output voltage VOUT at a predetermined voltage level. In addition, as shown in FIG. 1, the source follower 106 includes a current source 1062 and a P-type metal-oxide-semiconductor transistor 1064, wherein the current source 1062 provides a fixed current. A designer of the low dropout regulator 100 can properly design the current source 1062 and the P-type metal-oxide-semiconductor transistor 1064 to increase stability and operating bandwidth of the negative feedback loop.

When the supply voltage VCC starts to reduce (wherein the supply voltage VCC is not less than the output voltage VOUT yet) and a load (not shown in FIG. 1) coupled to the transmission transistor 108 needs to sink a larger current, because sizes of the P-type metal-oxide-semiconductor transistor 1064 and the transmission transistor 108 are fixed, the negative feedback loop will make a voltage of a node N1 and a voltage of a node N2 be reduced to make the transmission transistor 108 still have sufficient outputting current capability to stabilize the output voltage VOUT. That is, the negative feedback loop will make the voltage of the node N1 and the voltage of the node N2 be reduced to make the transmission transistor 108 still operate in a saturation region. However, because the voltage of the node N2 is reduced, meanwhile the voltage of the node N2 may force an output stage of error amplifier 102 to leave the saturation region to operate in a linear region, resulting in a loop gain of the negative feedback loop being reduced and the output voltage VOUT not being regulated at the predetermined voltage level.

In addition, when the supply voltage VCC is reduced to be equal to (or less than) the output voltage VOUT and the load still needs to sink the larger current, because the supply voltage VCC is reduced to be equal to (or less than) the output voltage VOUT and a voltage of a gate of the transmission transistor 108 cannot be reduced to zero, the transmission transistor 108 is forced to operate in a linear region, that is, the transmission transistor 108 cannot be completely turned on. Therefore, because the transmission transistor 108 cannot be completely turned on, a dropout voltage is increased, wherein the dropout voltage is equal to a difference between the supply voltage VCC and the output voltage VOUT, resulting in power consumption of the low dropout regulator 100 being significantly increased (because the power consumption of the low dropout regulator 100 is in positive proportion to the dropout voltage).

Therefore, because the low dropout regulator 100 has the above-mentioned disadvantages, how to improve low dropout regulator 100 has become an important issue for the designer.

SUMMARY OF THE INVENTION

An embodiment of the present invention provides a low dropout regulator with wide input supply voltage. The low dropout regulator includes a controller, an comparing circuit, a feedback circuit, an adjustable source follower, and an adjustable driving circuit. The controller is used for detecting a supply voltage. The feedback circuit, the comparing circuit, the adjustable source follower, and the adjustable driving circuit are used for regulating an output voltage according to a reference voltage. When the adjustable source follower and the adjustable driving circuit operate in a low-voltage mode, the controller further activates a first parallel metal-oxide-semiconductor transistor in the adjustable source follower and a second parallel metal-oxide-semiconductor transistor in the adjustable driving circuit.

Another embodiment of the present invention provides a low dropout regulator with wide input supply voltage, wherein the low dropout regulator regulates an output voltage according to a reference voltage. The low dropout regulator includes an adjustable driving circuit and a controller. The adjustable driving circuit includes a first transmission transistor and a second transmission transistor connected to the first transmission transistor in parallel. The controller detects a supply voltage. When the supply voltage is lower than a first reference voltage, the controller activates the second transmission transistor to increase the output voltage.

The present invention provides a low dropout regulator. The low dropout regulator utilizes a controller of the low dropout regulator to make an adjustable source follower of the low dropout regulator operate in a high-voltage mode, or in a low-voltage mode, or be turned off according to a supply voltage, and make an adjustable driving circuit of the low dropout regulator operate in the high-voltage mode, or in the low-voltage mode, or in a bypass mode according to the supply voltage, wherein when the adjustable source follower operates in the high-voltage mode and the low-voltage mode, the adjustable source follower operates in a saturation region, when the adjustable driving circuit operates in the high-voltage mode and the low-voltage mode, the adjustable driving circuit operates in the saturation region, and when the adjustable driving circuit operates in the bypass mode, the adjustable driving circuit operates in a linear region. Therefore, compared to the prior art, because the adjustable source follower can operate in the high-voltage mode, or in the low-voltage mode, or be turned off according to the supply voltage, and the adjustable driving circuit can operate in the high-voltage mode, or in the low-voltage mode, or in the bypass mode according to the supply voltage, regardless of the supply voltage, the low dropout regulator can always stably output an output voltage, provide a larger current to a load, maintain a loop gain of a negative feedback loop in the low dropout regulator when the supply voltage is high enough, and reduce an output dropout voltage when the supply voltage is lower.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
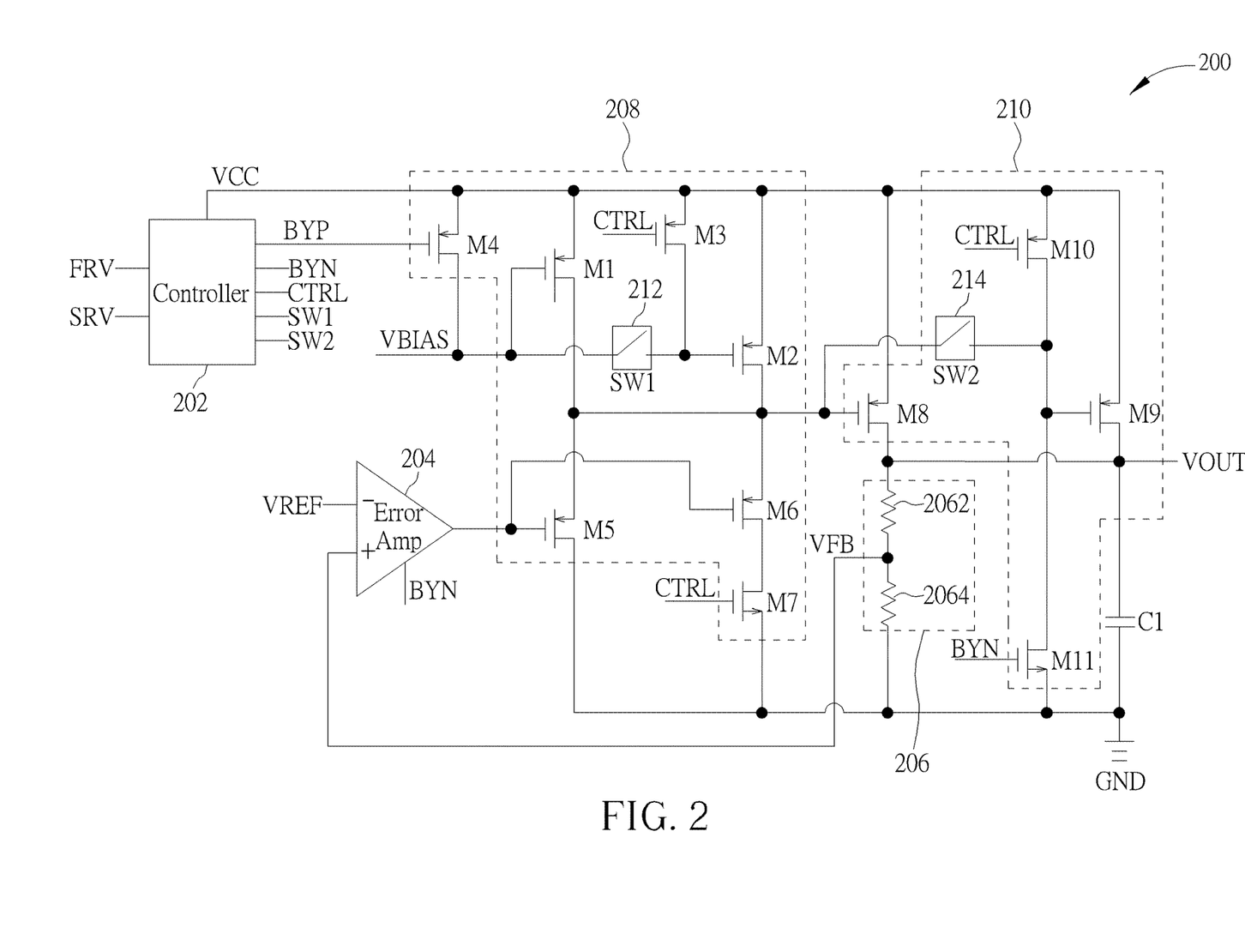
FIG. 2 is a diagram illustrating a low dropout regulator with wide input supply voltage according to a first embodiment of the present invention.

Please refer to FIG. 2. FIG. 2 is a diagram illustrating a low dropout regulator 200 with wide input supply voltage according to a first embodiment of the present invention, wherein the low dropout regulator 200 includes a controller 202, an comparing circuit 204, a feedback circuit 206, an adjustable source follower 208, an adjustable driving circuit 210, and a stabilization capacitor C1, wherein the comparing circuit 204 can be implemented by an error amplifier or other circuits with a function as the error amplifier. As shown in FIG. 2, the feedback circuit 206 includes resistors 2062, 2064, the adjustable source follower 208 includes P-type metal-oxide-semiconductor transistors M1-M6 (wherein the P-type metal-oxide-semiconductor transistors M2, M6 are parallel metal-oxide-semiconductor transistors in the adjustable source follower 208), an N-type metal-oxide-semiconductor transistor M7, and a switch 212, and the adjustable driving circuit 210 includes P-type metal-oxide-semiconductor transistors M8-M10 (wherein the P-type metal-oxide-semiconductor transistor M9 is a parallel metal-oxide-semiconductor transistor in the adjustable driving circuit 210), an N-type metal-oxide-semiconductor transistor M11, and a switch 214, wherein coupling relationships between the resistors 2062, 2064, the P-type metal-oxide-semiconductor transistors M1-M6, the N-type metal-oxide-semiconductor transistor M7, the switch 212, the P-type metal-oxide-semiconductor transistors M8-M10, the N-type metal-oxide-semiconductor transistor M11, the switch 214, and the stabilization capacitor C1 can be referred to FIG. 2, so further description thereof is omitted for simplicity. In addition, the present invention is not limited to the adjustable source follower 208 only including two parallel metal-oxide-semiconductor transistors (i.e. the P-type metal-oxide-semiconductor transistors M2, M6), that is, the adjustable source follower 208 can include more than two parallel metal-oxide-semiconductor transistors. In addition, the present invention is also not limited to the adjustable driving circuit 210 only including one parallel metal-oxide-semiconductor transistors (i.e. the P-type metal-oxide-semiconductor transistor M9), that is, the adjustable driving circuit 210 can include more than one parallel metal-oxide-semiconductor transistor. In addition, the controller 202, the comparing circuit 204, the feedback circuit 206, the adjustable source follower 208, and the adjustable driving circuit 210 are integrated in a monolithic chip, and the stabilization capacitor C1 is an element outside the monolithic chip. But, in another embodiment of the present invention, the stabilization capacitor C1 is integrated in the monolithic chip.

As shown in FIG. 2, the feedback circuit 206, the comparing circuit 204, the adjustable source follower 208, and the adjustable driving circuit 210 forma negative feedback loop to regulate an output voltage VOUT according to a reference voltage VREF, wherein the reference voltage VREF is a bandgap reference voltage, and not changed with temperature, process, and a supply voltage VCC. In addition, the P-type metal-oxide-semiconductor transistors M1, M2 act as fixed current sources, so the P-type metal-oxide-semiconductor transistors M1, M2 can make the adjustable source follower 208 have fixed sourcing capability; the P-type metal-oxide-semiconductor transistors M5, M6 are properly designed by a designer, so the P-type metal-oxide-semiconductor transistors M5, M6 can make the adjustable source follower 208 have high sinking capability. Therefore, because the adjustable source follower 208 has the fixed sourcing capability and the high sinking capability, the adjustable source follower 208 can provide a low impedance path to the adjustable driving circuit 210 to increase stability and operating bandwidth of the negative feedback loop. In addition, the stabilization capacitor C1 can stabilize the output voltage VOUT.

As shown in FIG. 2, when the comparing circuit 204, the adjustable source follower 208, and the adjustable driving circuit 210 operate in a saturation region, because the reference voltage VREF is equal to a feedback voltage VFB, a relationship between an output voltage VOUT and the reference voltage VREF can be determined according to equation (2):

$$VOUT = VREF\left(1 + \frac{R1}{R2}\right) \quad (2)$$

As shown in equation (2), R1 represents a resistance of the resistor 2062 and R2 represents a resistance of the resistor 2064.

Figure 3:
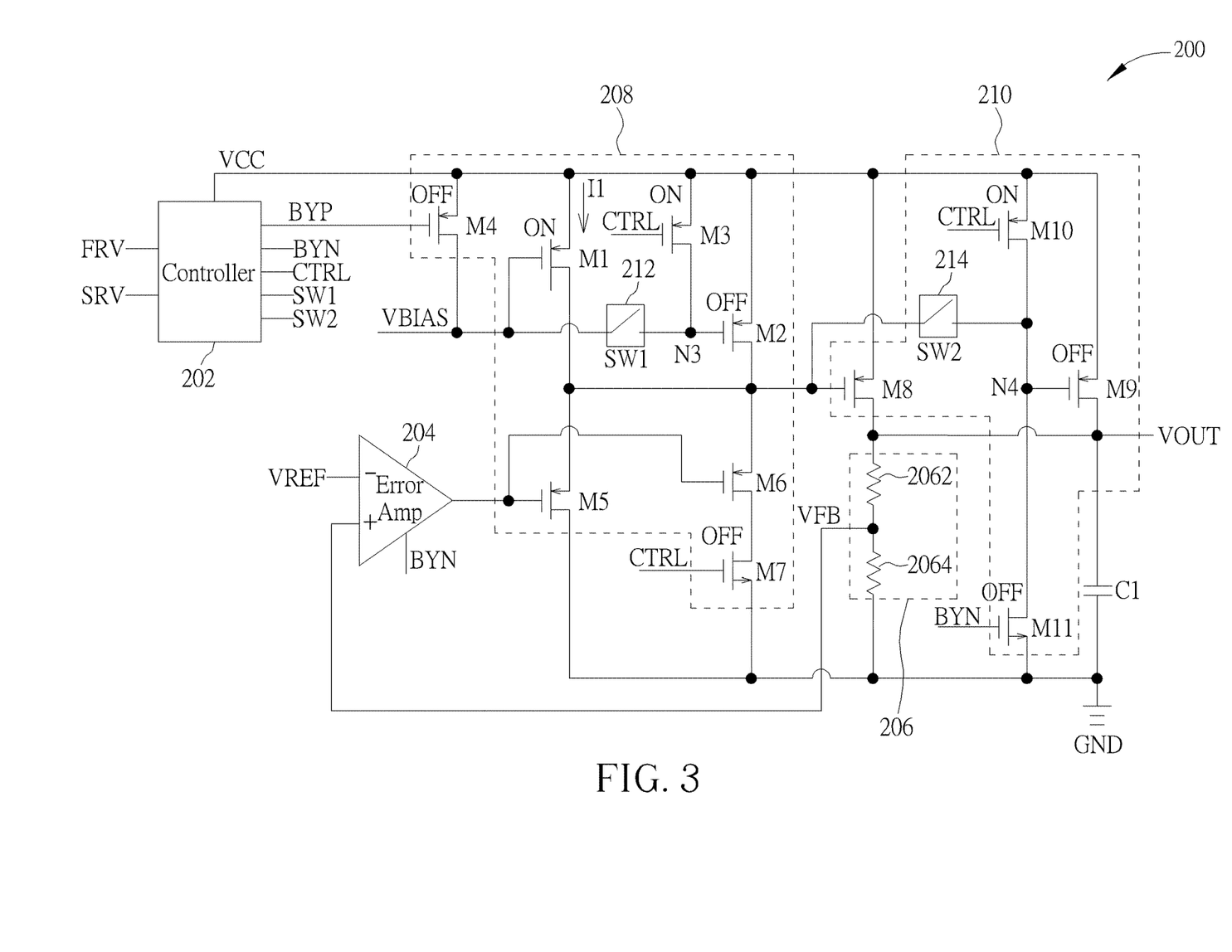
FIG. 3 is a diagram illustrating the low dropout regulator operating in the high-voltage mode.

The controller 202 can detect the supply voltage VCC. When the supply voltage VCC is greater than a first reference voltage FRV, the controller 202 can enable a control signal BYP and disable control signals BYN, CTRL, SW1, SW2 to make the adjustable source follower 208 and the adjustable driving circuit 210 operate in a high-voltage mode, and make the comparing circuit 204 be turned on. Therefore, as shown in FIG. 3, in the adjustable source follower 208, because the control signal BYP is enabled, the P-type metal-oxide-semiconductor transistor M4 is turned off; because the control signals CTRL, SW1 are disabled, the P-type metal-oxide-semiconductor transistor M3 is turned on and the switch 212 is turned off, resulting in a voltage of a node N3 being high to turn off the P-type metal-oxide-semiconductor transistor M2; and because the control signal CTRL is disabled, the N-type metal-oxide-semiconductor transistor M7 is turned off. In addition, the P-type metal-oxide-semiconductor transistor M1 is turned on to act as a first fixed current source to provide a first fixed current I1 according to a voltage VBIAS. Meanwhile, as shown in FIG. 3, the P-type metal-oxide-semiconductor transistors M1, M5 execute a source follower function of the adjustable source follower 208. In addition, as shown in FIG. 3, in the adjustable driving circuit 210, because the control signals CTRL, SW2 are disabled, the P-type metal-oxide-semiconductor transistor M10 is turned on and the switch 214 is turned off, resulting in a voltage of a node N4 being high to turn off the P-type metal-oxide-semiconductor transistor M9; and because the control signal BYN is disabled, the N-type metal-oxide-semiconductor transistor M11 is turned off. Meanwhile, as shown in FIG. 3, the P-type metal-oxide-semiconductor transistor M8 executes a driving circuit function of the adjustable driving circuit 210. Therefore, in the high-voltage mode, because the comparing circuit 204 operates normally (that is, the comparing circuit 204 operates in the saturation region), and the supply voltage VCC is high enough to make the P-type metal-oxide-semiconductor transistors M5, M8 operate in the saturation region, a loop gain of the negative feedback loop can be kept high. Therefore, in the high-voltage mode, the output voltage VOUT can be regulated at a predetermined voltage level.

Figure 4:
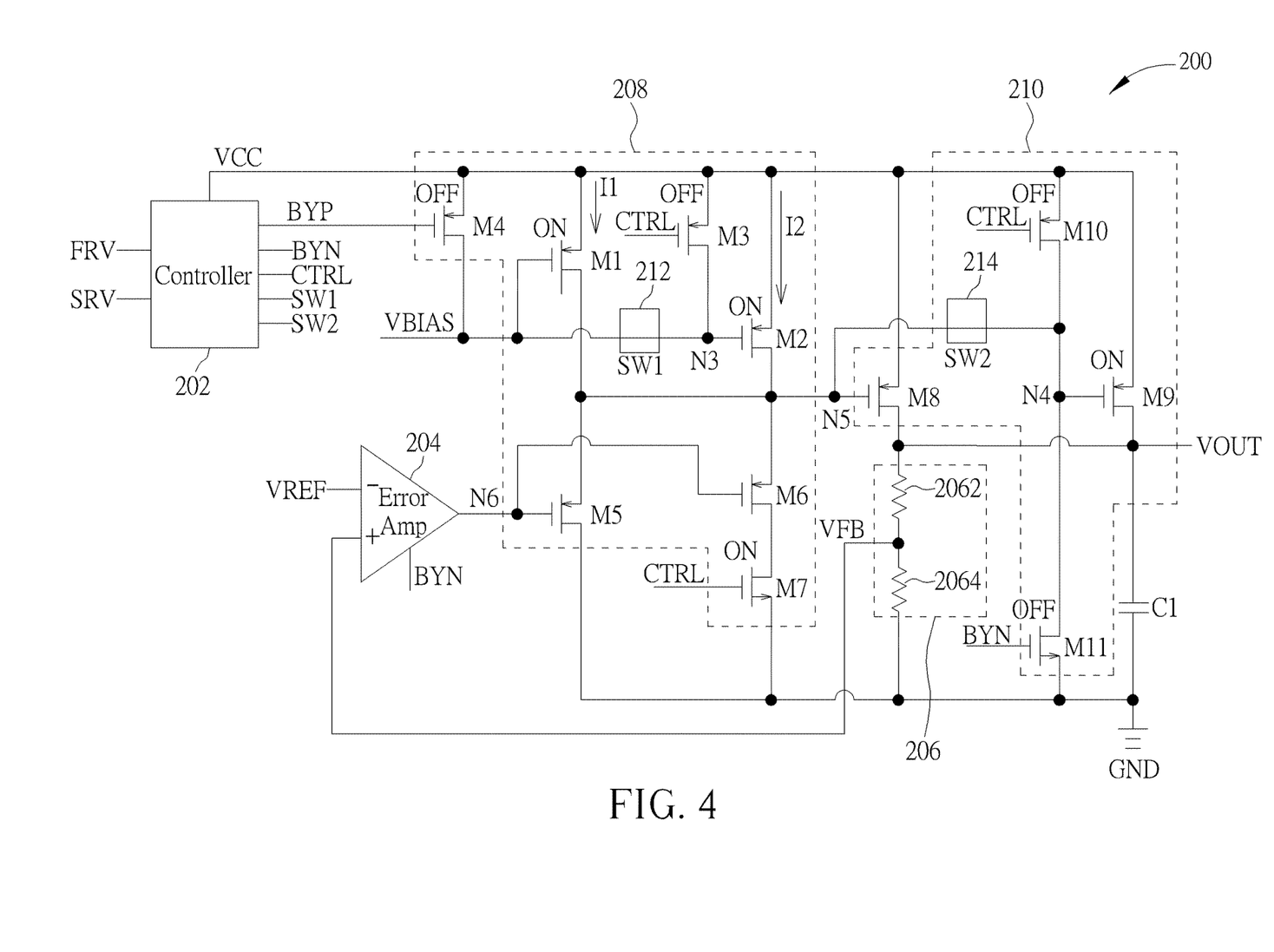
FIG. 4 is a diagram illustrating the low dropout regulator operating in the low-voltage mode.

When the supply voltage VCC is between the first reference voltage FRV and a second reference voltage SRV (wherein the first reference voltage FRV is greater than the second reference voltage SRV), the controller 202 can enable the control signals BYP, CTRL, SW1, SW2 and disable the control signal BYN to make the adjustable source follower 208 and the adjustable driving circuit 210 operate in a low-voltage mode, and make the comparing circuit 204 be turned on. Therefore, as shown in FIG. 4, in the adjustable driving circuit 210, because the control signals CTRL, SW2 are enabled, the P-type metal-oxide-semiconductor transistor M10 is turned off and the switch 214 is turned on, resulting in the P-type metal-oxide-semiconductor transistor M9 being turned on; and because the control signal BYN is disabled, the N-type metal-oxide-semiconductor transistor M11 is still turned off. Meanwhile, as shown in FIG. 4, the P-type metal-oxide-semiconductor transistors M8, M9 execute the driving circuit function of the adjustable driving circuit 210. As shown in FIG. 4, because gates of the P-type metal-oxide-semiconductor transistors M8, M9 are connected to each other, the P-type metal-oxide-semiconductor transistors M8, M9 can be regarded as in parallel to form a first equivalent P-type metal-oxide-semiconductor transistor. Therefore, because the first equivalent P-type metal-oxide-semiconductor transistor has greater driving capability than driving capability of each of the P-type metal-oxide-semiconductor transistors M8, M9, and a voltage difference between a source and a gate of the first equivalent P-type metal-oxide-semiconductor transistor is less than a voltage difference between a source and a gate of each of the P-type metal-oxide-semiconductor transistors M8, M9, a voltage drop corresponding to a node N5 can be reduced. In addition, because the first equivalent P-type metal-oxide-semiconductor transistor has greater driving capability, the first equivalent P-type metal-oxide-semiconductor transistor can provide a larger current to a load (not shown in FIG. 2). In addition, as shown in FIG. 4, in the adjustable source follower 208, because the control signal BYP is enabled, the P-type metal-oxide-semiconductor transistor M4 is turned off; because the control signals CTRL, SW1 are enabled, the P-type metal-oxide-semiconductor transistor M3 is turned off and the switch 212 is turned on, resulting in the voltage of the node N3 being equal to the voltage VBIAS to turn on the P-type metal-oxide-semiconductor transistor M2; and because the control signal CTRL is enabled, the N-type metal-oxide-semiconductor transistor M7 is turned on. In addition, the P-type metal-oxide-semiconductor transistor M1 is turned on to act as the first fixed current source to provide a first fixed current I1 according to the voltage VBIAS, and the P-type metal-oxide-semiconductor transistor M2 is also turned on to act as a second fixed current source to provide a second fixed current I2 according to the voltage VBIAS. Meanwhile, as shown in FIG. 4, the P-type metal-oxide-semiconductor transistors M1, M2, M5, M6 execute the source follower function of the adjustable source follower 208. Because gates of the P-type metal-oxide-semiconductor transistors M1, M2 are connected to each other, the P-type metal-oxide-semiconductor transistors M1, M2 can be regarded as in parallel to provide a larger sourcing current (the first fixed current I1 and the second fixed current I2) to compensate decrease of transient response of the negative loop due to larger parasitic capacitor of the first equivalent P-type metal-oxide-semiconductor transistor. In addition, because gates of the P-type metal-oxide-semiconductor transistors M5, M6 are connected to each other, the P-type metal-oxide-semiconductor transistors M5, M6 can be regarded as in parallel to form a second equivalent P-type metal-oxide-semiconductor transistor. Therefore, because the second equivalent P-type metal-oxide-semiconductor transistor has greater sinking capability than sinking capability of each of the P-type metal-oxide-semiconductor transistors M5, M6, and a voltage difference between a source and a gate of the second equivalent P-type metal-oxide-semiconductor transistor is less than a voltage difference between a source and a gate of each of the P-type metal-oxide-semiconductor transistors M5, M6, a voltage drop corresponding to a node N6 can be also reduced. Therefore, in the low-voltage mode, because the voltage drops corresponding to the nodes N5, N6 are reduced to make the P-type metal-oxide-semiconductor transistors M5, M6, M8, M9 operate in the saturation region and the comparing circuit 204 operate normally, the loop gain of the negative feedback loop can be still kept high. Therefore, in the low-voltage mode, the output voltage VOUT can be still regulated at the predetermined voltage level.

Figure 5:
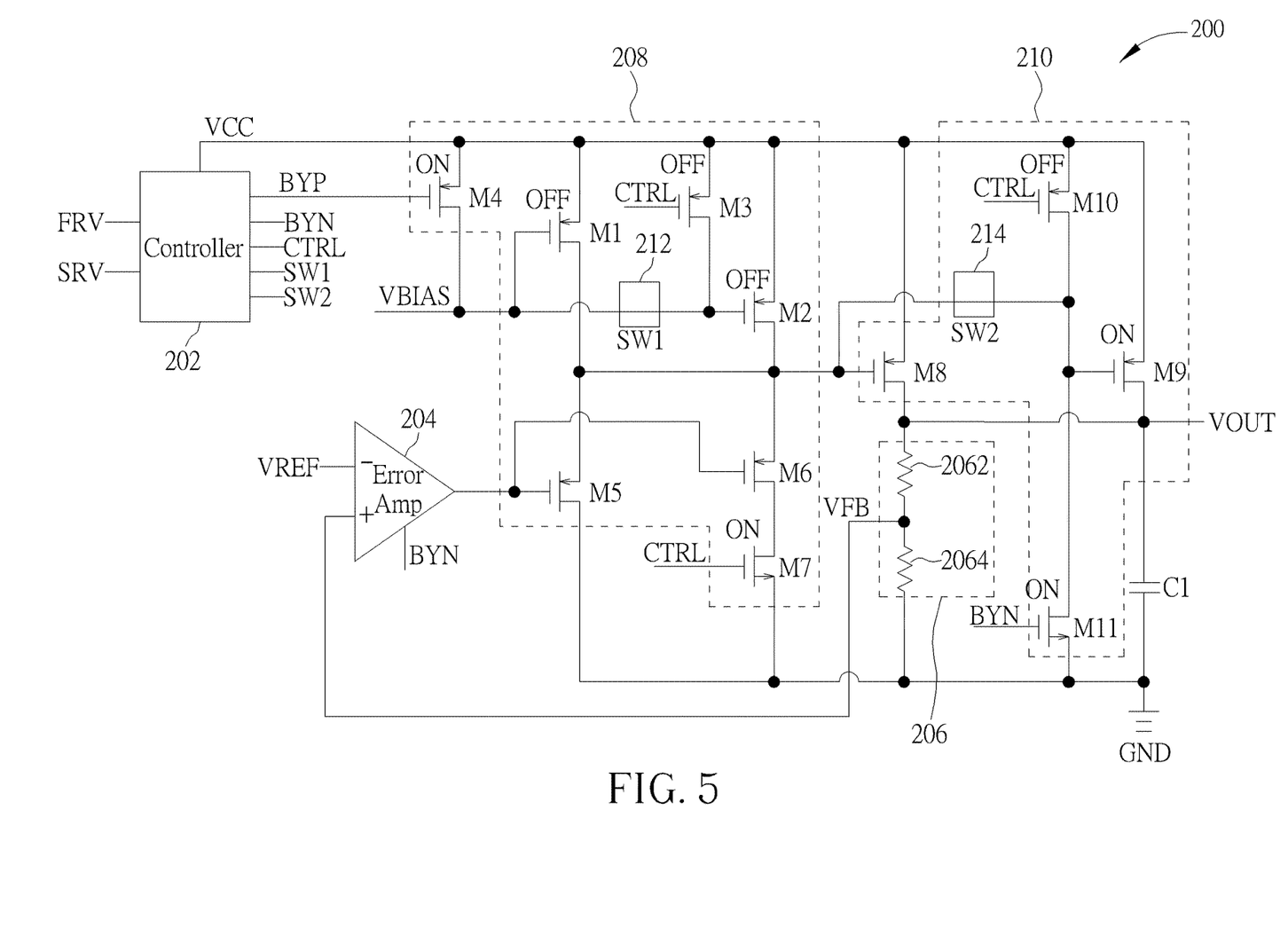
FIG. 5 is a diagram illustrating the low dropout regulator operating in the bypass mode.

When the supply voltage VCC is less than the second reference voltage SRV, the controller 202 can enable the control signals CTRL, SW1, SW2, BYN and disable the control signal BYP to make the adjustable source follower 208 and the comparing circuit 204 be turned off, and the adjustable driving circuit 210 operate in a bypass mode. Therefore, as shown in FIG. 5, in the adjustable source follower 208, because the control signal BYP is disabled, the P-type metal-oxide-semiconductor transistor M4 is turned on, resulting in the P-type metal-oxide-semiconductor transistors M1, M2 being turned off. In addition, as shown in FIG. 5, in the adjustable driving circuit 210, because the control signal CTRL is enabled, the P-type metal-oxide-semiconductor transistor M10 is turned off; because the control signals SW2, BYN are enabled, the N-type metal-oxide-semiconductor transistor M11 and the switch 214 are turned on, resulting in the gates of the P-type metal-oxide-semiconductor transistors M8, M9 being connected to ground GND. Therefore, the gates of the P-type metal-oxide-semiconductor transistors M8, M9 can receive a predetermined voltage (that is, potential of the ground GND) through turning-on of the N-type metal-oxide-semiconductor transistor M11, and the predetermined voltage can make the P-type metal-oxide-semiconductor transistors M8, M9 be substantially completely turned on. Because the P-type metal-oxide-semiconductor transistors M8, M9 are substantially completely turned on, the first equivalent P-type metal-oxide-semiconductor transistor (formed by the P-type metal-oxide-semiconductor transistors M8, M9 being in parallel) can provide a larger current to the load (not shown in FIG. 2). In addition, because the P-type metal-oxide-semiconductor transistors M8, M9 are substantially completely turned on, a dropout voltage of the first equivalent P-type metal-oxide-semiconductor transistor is decreased, resulting in power consumption of the low dropout regulator 200 being significantly decreased (because the power consumption of the low dropout regulator 200 is in positive proportion to the dropout voltage).

In addition, in the adjustable source follower 208, the P-type metal-oxide-semiconductor transistors M1, M2 belong to a first transistor circuits, and the P-type metal-oxide-semiconductor transistors M5, M6 belong to a second transistor circuits; in the adjustable driving circuit 210, the P-type metal-oxide-semiconductor transistor M8 can be regarded as a first transmission transistor and the P-type metal-oxide-semiconductor transistor M9 can be regarded as a second transmission transistor, wherein as shown in FIG. 2, the P-type metal-oxide-semiconductor transistor M9 (the second transmission transistor) is connected to the P-type metal-oxide-semiconductor transistor M8 (the first transmission transistor) in parallel.

Therefore, in the adjustable source follower 208, when the supply voltage VCC is between the first reference voltage FRV and the second reference voltage SRV, the controller 202 can activate parallel metal-oxide-semiconductor transistors (that is, the P-type metal-oxide-semiconductor transistors M2, M6) in the first and the second transistor circuits; in the adjustable driving circuit 210, when the supply voltage VCC is between the first reference voltage FRV and the second reference voltage SRV, or the supply voltage VCC is lower than the first reference voltage FRV, the controller 202 can activate the P-type metal-oxide-semiconductor transistor M9 (the second transmission transistor) to increase the output voltage VOUT.

In addition, one of ordinary skill in the art should clearly realize functions of the controller 202 through the above-mentioned corresponding descriptions of the controller 202, so one of ordinary skill in the art can easily implement the controller 202 through a field programmable gate array (FPGA) with the above-mentioned functions of the controller 202, or an application-specific integrated circuit (ASIC) with the above-mentioned functions of the controller 202, or a software module with the above-mentioned functions of the controller 202, or an analog integrated circuit with the above-mentioned functions of the controller 202. Therefore, further description of a corresponding structure of the controller 202 is omitted for simplicity.

In addition, the present invention is not limited to a structure and elements of the low dropout regulator 200 shown in FIG. 2. That is, any configuration in which each of the controller 202, the comparing circuit 204, the feedback circuit 206, the adjustable source follower 208, and the adjustable driving circuit 210 can execute a corresponding function falls in the scope of the present invention.

Figure 6:
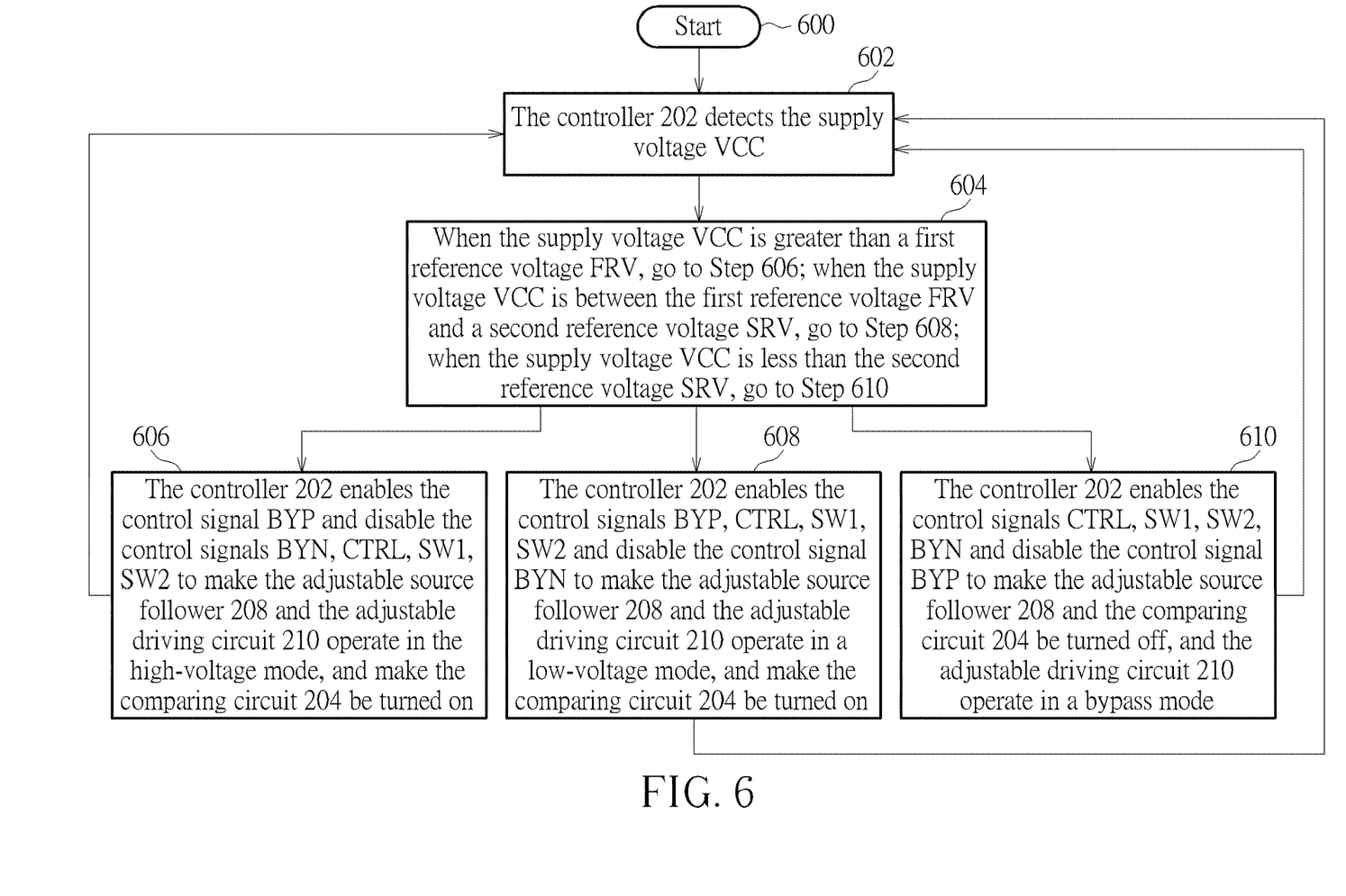
FIG. 6 is a flowchart illustrating an operational method of the low dropout regulator according to a second embodiment of the present invention.

Please refer to FIGS. 2-6. FIG. 6 is a flowchart illustrating an operational method of the low dropout regulator 200 according to a second embodiment of the present invention. The operational method in FIG. 6 is illustrated using the low dropout regulator 200 in FIG. 2. Detailed steps are as follows:

Step 600: Start.

Step 602: The controller 202 detects the supply voltage VCC.

Step 604: When the supply voltage VCC is greater than a first reference voltage FRV, go to Step 606; when the supply voltage VCC is between the first reference voltage FRV and a second reference voltage SRV, go to Step 608; when the supply voltage VCC is less than the second reference voltage SRV, go to Step 610.

Step 606: The controller 202 enables the control signal BYP and disable the control signals BYN, CTRL, SW1, SW2 to make the adjustable source follower 208 and the adjustable driving circuit 210 operate in the high-voltage mode, and make the comparing circuit 204 be turned on, go to Step 602.

Step 608: The controller 202 enables the control signals BYP, CTRL, SW1, SW2 and disable the control signal BYN to make the adjustable source follower 208 and the adjustable driving circuit 210 operate in a low-voltage mode, and make the comparing circuit 204 be turned on, go to Step 602.

Step 610: The controller 202 enables the control signals CTRL, SW1, SW2, BYN and disable the control signal BYP to make the adjustable source follower 208 and the comparing circuit 204 be turned off, and the adjustable driving circuit 210 operate in a bypass mode, go to Step 602.

In step 606, as shown in FIG. 3, in the adjustable source follower 208, because the P-type metal-oxide-semiconductor transistors M4, M2 and the N-type metal-oxide-semiconductor transistor M7 are turned off, the P-type metal-oxide-semiconductor transistors M1, M5 execute the source follower function of the adjustable source follower 208. In addition, as shown in FIG. 3, in the adjustable driving circuit 210, because the P-type metal-oxide-semiconductor transistor M9 and the N-type metal-oxide-semiconductor transistor M11 are turned off, the P-type metal-oxide-semiconductor transistor M8 executes the driving circuit function of the adjustable driving circuit 210. Therefore, in the high-voltage mode, because the comparing circuit 204 operates normally (that is, the comparing circuit 204 operates in the saturation region), and the supply voltage VCC is high enough to make the P-type metal-oxide-semiconductor transistors M5, M8 operate in the saturation region, the loop gain of the negative feedback loop can be kept high. Therefore, in the high-voltage mode, the output voltage VOUT can be regulated at a predetermined voltage level.

In step 608, as shown in FIG. 4, in the adjustable driving circuit 210, because the P-type metal-oxide-semiconductor transistor M10 and the N-type metal-oxide-semiconductor transistor M11 are turned off and the switch 214 is turned on, the P-type metal-oxide-semiconductor transistors M8, M9 execute the driving circuit function of the adjustable driving circuit 210. As shown in FIG. 4, because the gates of the P-type metal-oxide-semiconductor transistors M8, M9 are connected to each other, the P-type metal-oxide-semiconductor transistors M8, M9 can be regarded as in parallel to form the first equivalent P-type metal-oxide-semiconductor transistor, wherein the first equivalent P-type metal-oxide-semiconductor transistor has greater driving capability than driving capability of each of the P-type metal-oxide-semiconductor transistors M8, M9, and because the voltage difference between the source and the gate of the first equivalent P-type metal-oxide-semiconductor transistor is less than the voltage difference between the source and the gate of each of the P-type metal-oxide-semiconductor transistors M8, M9, the voltage drop corresponding to a node N5 can be reduced. In addition, because the first equivalent P-type metal-oxide-semiconductor transistor has greater driving capability, the first equivalent P-type metal-oxide-semiconductor transistor can provide the larger current to a load. In addition, as shown in FIG. 4, in the adjustable source follower 208, because the P-type metal-oxide-semiconductor transistors M4, M3 are turned off and the switch 212 and the N-type metal-oxide-semiconductor transistor M7 are turned on, the P-type metal-oxide-semiconductor transistors M1, M2, M5, M6 execute the source follower function of the adjustable source follower 208. In addition, because the gates of the P-type metal-oxide-semiconductor transistors M5, M6 are connected to each other, the P-type metal-oxide-semiconductor transistors M5, M6 can be regarded as in parallel to form the second equivalent P-type metal-oxide-semiconductor transistor. Therefore, because the second equivalent P-type metal-oxide-semiconductor transistor has greater sinking capability than sinking capability of each of the P-type metal-oxide-semiconductor transistors M5, M6, and the voltage difference between the source and the gate of the second equivalent P-type metal-oxide-semiconductor transistor is less than the voltage difference between the source and the gate of each of the P-type metal-oxide-semiconductor transistors M5, M6, the voltage drop corresponding to the node N6 can be also reduced. Therefore, in the low-voltage mode, because the voltage drops corresponding to the nodes N5, N6 are reduced to make the P-type metal-oxide-semiconductor transistors M5, M6, M8, M9 operate in the saturation region and the comparing circuit 204 operate normally, the loop gain of the negative feedback loop can be still kept high. Therefore, in the low-voltage mode, the output voltage VOUT can be still regulated at the predetermined voltage level.

In step 610, as shown in FIG. 5, in the adjustable source follower 208, because the P-type metal-oxide-semiconductor transistor M4 and the switch 212 are turned on and the P-type metal-oxide-semiconductor transistors M1, M2 are turned off, the source follower function of the adjustable source follower 208 is disabled. In addition, as shown in FIG. 5, in the adjustable driving circuit 210, because the P-type metal-oxide-semiconductor transistor M10 is turned off and the N-type metal-oxide-semiconductor transistor M11 and the switch 214 are turned on, the P-type metal-oxide-semiconductor transistors M8, M9 being connected to the ground GND. Therefore, the predetermined voltage (the potential of the ground GND) can make the P-type metal-oxide-semiconductor transistors M8, M9 be substantially completely turned on. Because the P-type metal-oxide-semiconductor transistors M8, M9 are substantially completely turned on, the first equivalent P-type metal-oxide-semiconductor transistor (formed by the P-type metal-oxide-semiconductor transistors M8, M9 being in parallel) can provide a larger current to the load (not shown in FIG. 2). In addition, because the P-type metal-oxide-semiconductor transistors M8, M9 are substantially completely turned on, the dropout voltage of the first equivalent P-type metal-oxide-semiconductor transistor is decreased, resulting in power consumption of the low dropout regulator 200 being significantly decreased.

To sum up, the low dropout regulator utilizes the controller to make the adjustable source follower operate in the high-voltage mode, or in the low-voltage mode, or be turned off according to the supply voltage, and make the adjustable driving circuit operate in the high-voltage mode, or in the low-voltage mode, or in the bypass mode according to the supply voltage, wherein when the adjustable source follower operates in the high-voltage mode and the low-voltage mode, the adjustable source follower operates in the saturation region, and when the adjustable driving circuit operates in the high-voltage mode and the low-voltage mode, the adjustable driving circuit operates in the saturation region, and when the adjustable driving circuit operates in the bypass mode, the adjustable driving circuit operates in a linear region. Therefore, compared to the prior art, because the adjustable source follower can operate in the high-voltage mode, or in the low-voltage mode, or be turned off according to the supply voltage, and the adjustable driving circuit can operate in the high-voltage mode, or in the low-voltage mode, or in the bypass mode according to the supply voltage, regardless of the supply voltage, the low dropout regulator can stably output the output voltage, provide the larger current to the load, maintain the loop gain of the negative feedback loop when the supply voltage is high enough, and reduce an output dropout voltage when the supply voltage is lower.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low dropout regulator with wide input supply voltage, comprising:
   a controller detecting a supply voltage;
   an comparing circuit;
   a feedback circuit;
   an adjustable source follower; and
   an adjustable driving circuit;
   wherein the feedback circuit, the comparing circuit, the adjustable source follower, and the adjustable driving circuit are used for regulating an output voltage according to a reference voltage;
   wherein when the supply voltage is greater than a first reference voltage or the supply voltage is between the first reference voltage and a second reference voltage, the comparing circuit is turned on, when the supply voltage is less than the second reference voltage, the comparing circuit is turned off, and when the supply voltage is between the first reference voltage and the second reference voltage, the controller further activates a first parallel metal-oxide-semiconductor transistor in the adjustable source follower and a second parallel metal-oxide-semiconductor transistor in the adjustable driving circuit.

2. The low dropout regulator of claim 1, further comprising:

a stabilization capacitor stabilizing the output voltage.

3. The low dropout regulator of claim 1, wherein the feedback circuit, the comparing circuit, the adjustable source follower, and the adjustable driving circuit form a negative feedback loop to regulate the output voltage according to the reference voltage.

4. The low dropout regulator of claim 3, wherein the adjustable source follower has high sinking capability and fixed sourcing capability, and provides a low impedance path to the adjustable driving circuit to increase stability and operating bandwidth of the negative feedback loop.

5. The low dropout regulator of claim 1, wherein when the supply voltage is greater than the first reference voltage, the adjustable source follower and the adjustable driving circuit operate in a high-voltage mode, when the supply voltage is between the first reference voltage and the second reference voltage, the adjustable source follower and the adjustable driving circuit operate in a low-voltage mode, and when the supply voltage is less than the second reference voltage, the adjustable source follower is turned off and the adjustable driving circuit operates in a bypass mode.

6. The low dropout regulator of claim 5, wherein when the adjustable driving circuit operates in the bypass mode, gates of metal-oxide-semiconductor transistors in the adjustable driving circuit receive a predetermined voltage, and the predetermined voltage makes the metal-oxide-semiconductor transistors be substantially completely turned on.

7. The low dropout regulator of claim 1, wherein the comparing circuit is coupled to the controller; the feedback circuit is coupled to the comparing circuit; the adjustable source follower is coupled to the controller and the comparing circuit; and the adjustable driving circuit is coupled to the controller, the adjustable source follower, and the feedback circuit.

8. The low dropout regulator of claim 1, wherein the reference voltage is a bandgap reference voltage, and not changed with temperature, process, and the supply voltage.

9. The low dropout regulator of claim 1, wherein the controller, the comparing circuit, the feedback circuit, the adjustable source follower, and the adjustable driving circuit are integrated in a monolithic chip.

10. The low dropout regulator of claim 1, wherein when the adjustable driving circuit operates in a bypass mode, the controller further activates the second parallel metal-oxide-semiconductor transistor in the adjustable driving circuit.

11. A low dropout regulator with wide input supply voltage, the low dropout regulator regulating an output voltage according to a reference voltage and comprising:

an adjustable driving circuit comprising a first transmission transistor and a second transmission transistor connected to the first transmission transistor in parallel; and a controller detecting a supply voltage;

wherein when the supply voltage is between a first reference voltage and a second reference voltage or the supply voltage is lower than the second reference voltage, the controller activates the second transmission transistor to increase the output voltage, and the second reference voltage is less than the first reference voltage.

12. The low dropout regulator of claim 11, further comprising:

an comparing circuit;

a feedback circuit; and an adjustable source follower comprising a first and a second transistor circuits, wherein the controller optionally activates transistors connected in parallel in the first transistor circuits and transistors connected in parallel in the second transistor circuits;

wherein the feedback circuit, the comparing circuit, the adjustable source follower, and the adjustable driving circuit regulates the output voltage according to the reference voltage.

13. The low dropout regulator of claim 12, wherein when the supply voltage is between the first reference voltage and the second reference voltage, the controller activates parallel metal-oxide-semiconductor transistors in the first and the second transistor circuits.

14. The low dropout regulator of claim 12, wherein when the supply voltage is greater than the first reference voltage, the adjustable source follower and the adjustable driving circuit operate in a high-voltage mode, when the supply voltage is between the first reference voltage and the second reference voltage, the adjustable source follower and the adjustable driving circuit operate in the low-voltage mode, and when the supply voltage is less than the second reference voltage, the adjustable source follower is turned off and the adjustable driving circuit operates in a bypass mode.

15. A low dropout regulator with wide input supply voltage, comprising:

a controller detecting a supply voltage;

an comparing circuit;

a feedback circuit;

an adjustable source follower; and an adjustable driving circuit;

wherein the feedback circuit, the comparing circuit, the adjustable source follower, and the adjustable driving circuit are used for regulating an output voltage according to a reference voltage;

wherein when the adjustable source follower operates in a low-voltage mode, the controller further activates a first parallel metal-oxide-semiconductor transistor in the adjustable source follower, and when the adjustable driving circuit operates in the low-voltage mode or a bypass mode, the controller further activates a second parallel metal-oxide-semiconductor transistor in the adjustable driving circuit.

* * * * *